United States Patent [19]

Murata

[11] Patent Number: 5,757,216

[45] Date of Patent: May 26, 1998

[54] ELECTRONIC DEVICE USING PHASE SYNCHRONOUS CIRCUIT

[75] Inventor: Toshihiko Murata, Kawasaki, Japan

[73] Assignee: Fujitsu Limited, Kawasaki, Japan

[21] Appl. No.: 820,358

[22] Filed: Mar. 12, 1997

Related U.S. Application Data

[63] Continuation of Ser. No. 518,312, Aug. 23, 1995, abandoned.

[30] Foreign Application Priority Data

Feb. 2, 1995 [JP] Japan ................................ 7-016268

[51] Int. Cl.$^6$ .......................... H03L 7/087; H03L 7/093
[52] U.S. Cl. ...................... 327/156; 327/147; 331/14; 331/17
[58] Field of Search ................................ 331/14, 17, 25; 327/147, 148, 156, 157, 158; 375/375, 376

[56] References Cited

U.S. PATENT DOCUMENTS

| | | | |
|---|---|---|---|
| 3,939,438 | 2/1976 | Taylor | 331/14 |
| 4,262,264 | 4/1981 | Vandergraaf | 331/14 |
| 4,365,211 | 12/1982 | Lee | 331/14 |
| 4,387,342 | 6/1983 | Grosjean | 331/14 |
| 4,745,372 | 5/1988 | Miwa | 331/17 |
| 4,942,371 | 7/1990 | Kashiwaba et al. | 331/17 |
| 4,987,387 | 1/1991 | Kennedy et al. | 331/17 |
| 5,202,906 | 4/1993 | Saito et al. | 331/14 |
| 5,276,913 | 1/1994 | Lee et al. | 331/14 |
| 5,281,930 | 1/1994 | Taromaru | 331/17 |
| 5,347,233 | 9/1994 | Ishibashi | 331/17 |
| 5,379,002 | 1/1995 | Tokura | 331/14 |

*Primary Examiner*—Timothy P. Callahan
*Assistant Examiner*—T. T. Lam
*Attorney, Agent, or Firm*—Armstrong, Westerman, Hattori, McLeland & Naughton

[57] ABSTRACT

In a phase synchronous circuit, a phase of a reference signal and a phase of a compared signal that corresponds to an oscillation signal output by an oscillator are compared with each other a phase comparison output signal which corresponds to a phase difference is fed to the oscillator via a filter so that the oscillator is controlled. A control circuit provided in the phase synchronous circuit causes an output value of the phase comparison output signal to vary nonlinearly in accordance with the phase difference.

15 Claims, 14 Drawing Sheets

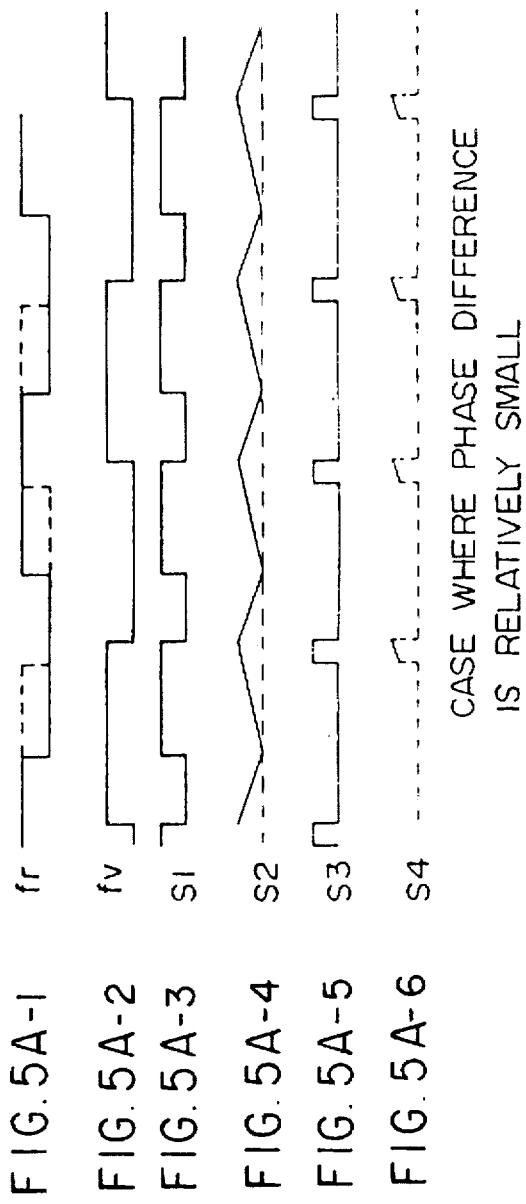

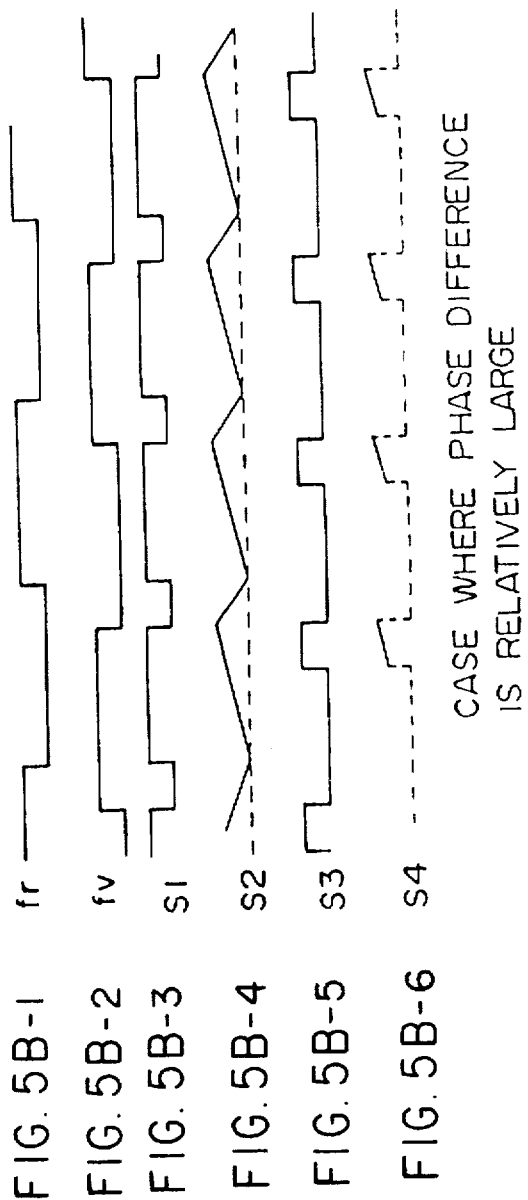

F I G. 10
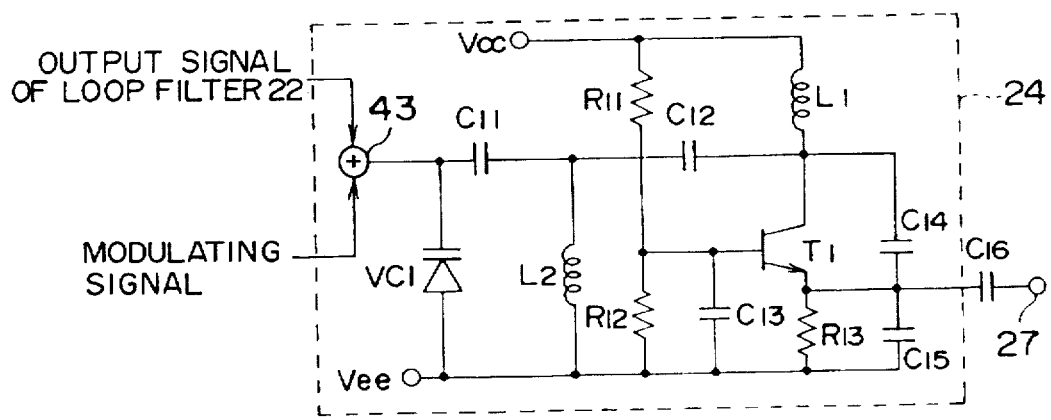

5,757,216

ELECTRONIC DEVICE USING PHASE SYNCHRONOUS CIRCUIT

This application is a continuation of application Ser. No. 08/518,312, filed Aug. 23, 1995, now abandoned.

BACKGROUND OF THE INVENTION

1. Field of the Invention

The present invention relates to phase synchronous circuits for placing an output signal and a reference signal in phase, and more particularly to a phase synchronous circuit suitably adapted to a modulating circuit configured to cause the frequency of an output signal to vary in accordance with a modulating signal such as an audio signal. The present invention further relates to a circuit device that constitutes the phase synchronous circuit and an electronic apparatus such as a portable telephone set in which the phase synchronous circuit is used.

2. Description of the Related Art

Conventionally, a phase synchronous circuit for placing an output signal and a reference signal in phase is used in various electronic apparatuses. The phase synchronous circuit is usually equipped with a phase-locked loop (PLL) circuit and configured to obtain a stable output signal. The PLL circuit is equipped with a voltage-controlled oscillator and linearly controls a frequency of an oscillation signal generated by the voltage-controlled oscillator, in accordance with a control signal that corresponds to a phase difference.

FIG. 1 shows a conventional phase synchronous circuit that forms a modulating circuit. The phase synchronous circuit comprises a phase comparator 10, a charge pump 11, a loop filter 12, a low pass filter 13, a voltage-controlled oscillator (VCO) 14, a frequency divider 15, a reference signal input terminal 16 and an oscillation output terminal 17. By providing the phase synchronous circuit having the above construction with a modulating signal input terminal 18 and a signal line 19 connected to an input terminal (which is fed an output signal of the low pass filter 13) of the VCO 14, a modulating circuit is forms.

The phase comparator 10 compares the phase of a reference signal fed to the terminal 16 with the phase of an output signal (compared signal) of the frequency divider 15, and outputs a phase comparison output signal that corresponds to a phase difference to a charge pump 11. If the compared signal leads the reference signal, the charge pump 11 sets the amplitude of a drive signal for driving the loop filter 12 to be relatively small. If the compared signal lags the reference signal, the charge pump 11 sets the amplitude of the drive signal to be relatively large. The loop filter 12 comprises resistors R1 and R2, and a capacitor C1. The loop filter 12 stores charges that correspond to the drive signal in the capacitor C1 and controls the VCO 14 via the low pass filter 13. A modulating signal is superimposed on the output signal of the low pass filter 13 so that the oscillation frequency of the VCO 14 is controlled. The oscillation output is output via the output terminal 17 and also subjected to frequency division by the frequency divider 15.

The response time and modulation characteristic of the phase synchronous circuit that forms the modulating circuit depend on a natural frequency ($\omega n$) defined below:

$$\omega n = \sqrt{\frac{K\phi \times Kvco}{C1 \times (R1 + R2)}}$$

where

K$\phi$: phase comparison sensitivity;

Kvco: VCO control sensitivity

R1, R2, C1: resistance value and capacitance value in the loop filter 12.

The phase comparison sensitivity K$\phi$ is determined by the phase comparator 10 and the charge pump 11, and represents a variation in the output voltage of the charge pump 11 with a phase difference. The VCO control sensitivity Kvco represents a variation in the oscillation frequency with a control voltage of the VCO 14.

Thus, the response time and the modulation characteristic of the phase synchronous circuit depend on the natural frequency. Hence, a high-speed response is incompatible with a variation in the oscillation frequency in the low oscillation frequency range in accordance with a low-speed variation in the modulating signal. To be more exact, there is a problem in that the phase synchronous circuit having a high-speed response responds to a slow amplitude variation of the modulating signal, resulting in the oscillation frequency being locked and in a failure to obtain a variation in the oscillation frequency in accordance with the amplitude variation of the modulating signal.

Since an output signal of the charge pump 11 varies between a power supply voltage and a ground voltage, there is a likelihood that a sideband is produced in the oscillation output signal. The low pass filter 13 is normally used to eliminate the sideband. However, there is a problem in that the low pass filter 13 should be constructed with multiple stages in order to eliminate the sideband effectively (in the example shown in FIG. 1, two stages are used), resulting in an increase in the cost and a large space required to accommodate the filter.

SUMMARY OF THE INVENTION

Accordingly, an object of the present is to provide a novel and useful phase synchronous circuit in which the aforementioned problems are eliminated, and to provide a circuit device that forms such a phase synchronous circuit and an electronic apparatus in which such a phase synchronous circuit is used.

Another and more specific object of the present invention is to provide a phase synchronous circuit in which a response speed can be varied in accordance with a phase difference, and to provide a circuit device that constitutes such a phase synchronous circuit and an electronic apparatus in which such a phase synchronous circuit is used.

The aforementioned objects can be achieved by a phase synchronous circuit in which a phase of a reference signal and a phase of a compared signal which corresponds to an oscillation signal output by an oscillator are compared with each other so that a phase comparison output signal that corresponds to a phase difference is fed to the oscillator via a filter, the phase synchronous circuit comprising a control circuit that enables an output value of the phase comparison output signal to vary nonlinearly in accordance with the phase difference. According to the phase synchronous circuit of the present invention, it is possible to set a desired operating condition (response speed) in accordance with the oscillation frequency, by a control circuit causing an output value of a phase comparison output signal to vary nonlinearly in accordance with a phase difference.

In a preferable phase synchronous circuit, the control circuit controls the phase comparison output signal so that a phase comparison sensitivity that specifies the output value of the phase comparison output signal with respect to the phase difference becomes small as the phase difference becomes small.

In another preferable phase synchronous circuit, the control circuit controls the phase comparison output signal so that a variation in an amplitude of the phase comparison output signal becomes small as the phase difference becomes small.

In a preferred embodiment of the phase synchronous circuit, the control circuit comprises: a ripple filter circuit smoothing the phase comparison output signal; a switch circuit selectively outputting an output signal of the ripple filter circuit using a switch signal; and a phase comparator outputting the switch signal in accordance with a phase difference between a signal obtained by delaying the reference signal and the compared signal. According to this aspect of the present invention, it is possible to cause the phase comparison output signal to vary nonlinearly in accordance with the phase difference. Because a smoothed signal is used to drive the filters, unnecessary sideband components are produced in very small quantity, thus eliminating a need to provide a low pass filter that has been conventionally necessary.

In another preferred embodiment of the phase synchronous circuit, the oscillation signal includes a modulating signal. According to this aspect of the present invention, the response speed is raised when an in-phase condition is to be established, and, once the in-phase condition has been established and the oscillation frequency is to be controlled in accordance with the modulating signal, the response speed is lowered. Thus, it is possible to cause the oscillation frequency to vary in accordance with the modulating signal even in a low frequency range.

The aforementioned objects can also be achieved by a circuit device comprising: a phase comparator comparing a phase of a reference signal with a phase of a compared signal that corresponds to an oscillation signal output by an oscillator, and outputting a phase comparison output signal that corresponds to a phase difference; a control circuit causing an output value of the phase comparison output signal nonlinearly in accordance with the phase difference; and a terminal connectable to an external filter which is connectable to an output of the control circuit and connectable to the oscillator. According to the circuit device of the present invention, the size of the circuit device can be successfully reduced by installing a filter as an external component, an added advantage of this construction being that a user can arbitrarily set the characteristic of the filter.

In a preferable circuit device, the control circuit comprises: a ripple filter circuit smoothing the phase comparison output signal; a switch circuit selectively outputting an output signal of the ripple filter circuit using a switch signal; and a phase comparator outputting the switch signal in accordance with a phase difference between a signal obtained by delaying the reference signal and the compared signal.

In another preferable circuit device, the control circuit comprises: a terminal connectable to a ripple filter circuit smoothing the phase comparison output signal; a switch circuit selectively outputting an output signal of the ripple filter circuit using a switch signal; and a phase comparator outputting the switch signal in accordance with a phase difference between a signal obtained by delaying the reference signal and the compared signal. According to this aspect of the present invention, the size of the circuit device can be successfully reduced by installing a ripple filter circuit that constitutes the control circuit as an external component, an added advantage being that a user can arbitrarily set the characteristic of the filter.

In a preferred embodiment of the circuit device, the control circuit controls the phase comparison output signal so that a phase comparison sensitivity that specifies the output value of the phase comparison output signal with respect to the phase difference becomes small as the phase difference becomes small.

In another preferred embodiment of the circuit device, wherein the control circuit controls the phase comparison output signal so that a variation in an amplitude of the phase comparison output signal becomes small as the phase difference becomes small.

In still another preferred embodiment of the circuit device, the oscillation signal includes a modulating signal.

The aforementioned objects of the present invention can also be achieved by an electronic apparatus comprising: a modulating circuit whose output signal has a frequency that varies in accordance with a modulating signal; a mixer circuit converting the output signal from the modulating circuit to have a transmit signal frequency; an amplifier amplifying an output signal of the mixer circuit; and an antenna transmitting an output signal of the amplifier, the modulating circuit including a phase synchronous circuit, the phase synchronous circuit being constructed such that a a phase of a reference signal and a phase of a compared signal that corresponds to an output signal of the modulating circuit output via an oscillator are compared with each other, and the oscillator is controlled by feeding a phase comparison output signal that corresponds to a phase difference to the oscillator via a filter, and the phase synchronous circuit comprising a control circuit causing an output value of the phase comparison output signal to vary nonlinearly in accordance with the phase difference. According to the electronic apparatus of the present invention, it is possible to cause the phase comparison output signal to vary nonlinearly in accordance with the phase difference.

In a preferable electronic apparatus, the control circuit controls the phase comparison output signal so that a phase comparison sensitivity that specifies the output value of the phase comparison output signal with respect to the phase difference becomes small as the phase difference becomes small.

In another preferable electronic apparatus, the control circuit controls the phase comparison output signal so that a variation in an amplitude of the phase comparison output signal becomes small as the phase difference becomes small.

In a preferred embodiment of the electronic apparatus, the modulating signal is an audio signal. Accordingly, the present invention is applicable to a telephone set.

BRIEF DESCRIPTION OF THE DRAWINGS

Other objects and further features of the present invention will be apparent from the following detailed description when read in conjunction with the accompanying drawings, in which:

FIGS. 5A and 5B are timing charts showing an operation of the construction shown in FIG. 4;

FIG. 10 is a block diagram showing an example of the construction of a voltage-controlled oscillator (VCO) shown in FIG. 4;

DESCRIPTION OF THE PREFERRED EMBODIMENTS

Figure 2:
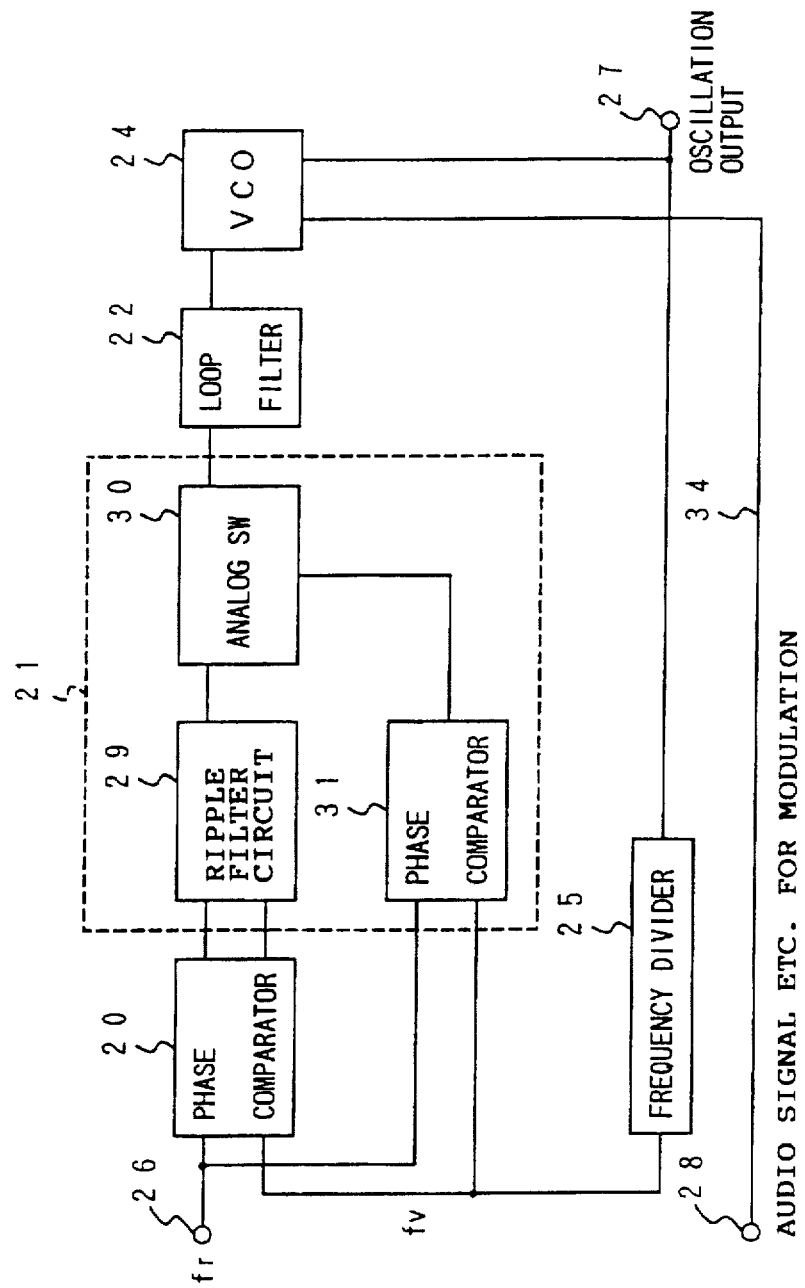
FIG. 2 is a block diagram showing a construction of an embodiment of the phase synchronous circuit of the present invention.

FIG. 2 is a block diagram showing a construction of a first embodiment of the phase synchronous circuit according to the present invention. The phase synchronous circuit shown in FIG. 2 is comprises a phase comparator 20, a response speed control circuit 21, a loop filter 22, a voltage-controlled oscillator (VCO) 24, a frequency divider 25, a reference signal input terminal 26 and an oscillation signal output terminal 27. By providing the phase synchronous circuit having the above construction with a modulating signal input terminal 28 and a signal line 34 connected to an input terminal (which is fed an output signal of the loop filter 22) of the VCO 24, a modulating circuit using the phase synchronous circuit is formed.

The phase comparator 20 compares the phase of the reference signal fr fed to the terminal 26 with the phase of the output signal (compared signal) fv of the frequency divider 25, and outputs a phase comparison output signal which corresponds to a phase difference to the control circuit 21.

The control circuit 21 enables a response speed of the phase synchronous circuit to vary depending on the phase difference, by controlling a control signal fed to the loop filter 22. In other words, the control circuit 21 causes a phase comparison sensitivity, indicating a magnitude (for example, an amplitude value) of the control signal fed to the loop filter 22 in accordance with a phase difference, to vary depending on the phase difference. Specifically, the control circuit 21 controls the control signal fed to the loop filter 2 such that a response characterized by a high speed and a high phase comparison sensitivity is realized in case the phase difference is large, and a response characterized by a low speed and a low phase comparison sensitivity is realized in case the phase difference is small. When the phase difference is so large that the frequency of the reference signal fr is changed, the phase synchronous circuit establishes an in-phase condition at a high speed. When the oscillated signal is made to vary depending on the modulating signal in a state where the in-phase condition is established, the phase synchronous circuit responds at a low speed. Thereby, it is possible to cause the oscillation frequency of the VCO 24 to vary according to a slow variation in the modulating signal.

Figure 1:
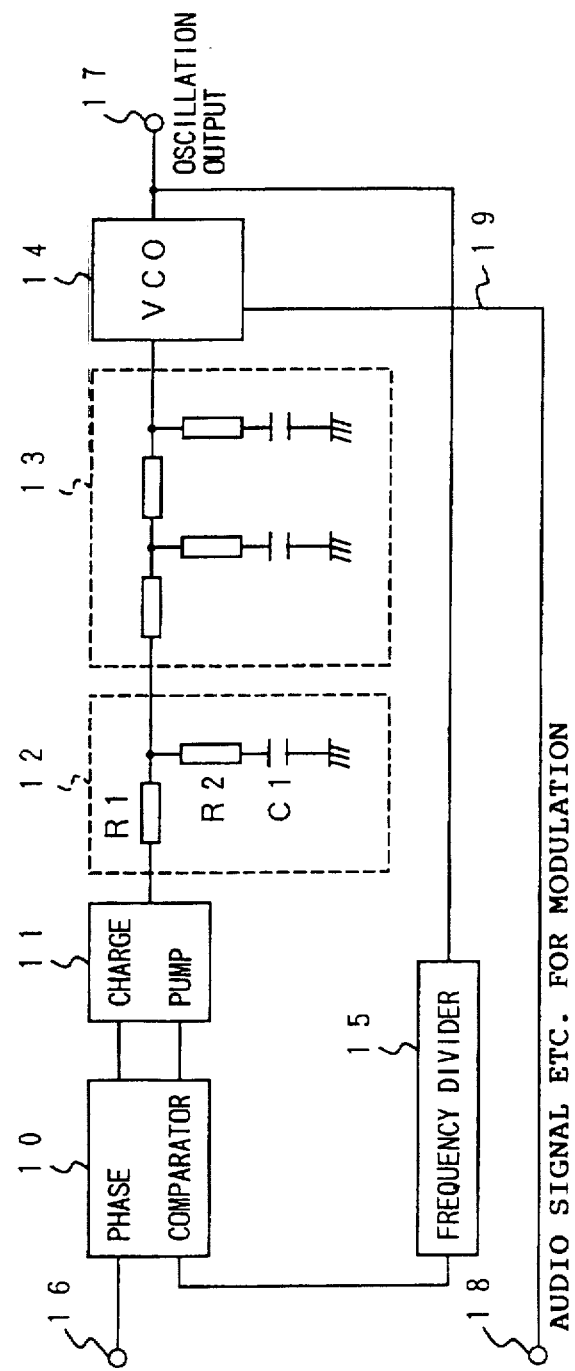
FIG. 1 is a block diagram showing a construction of a conventional phase synchronous circuit.
Figure 3:
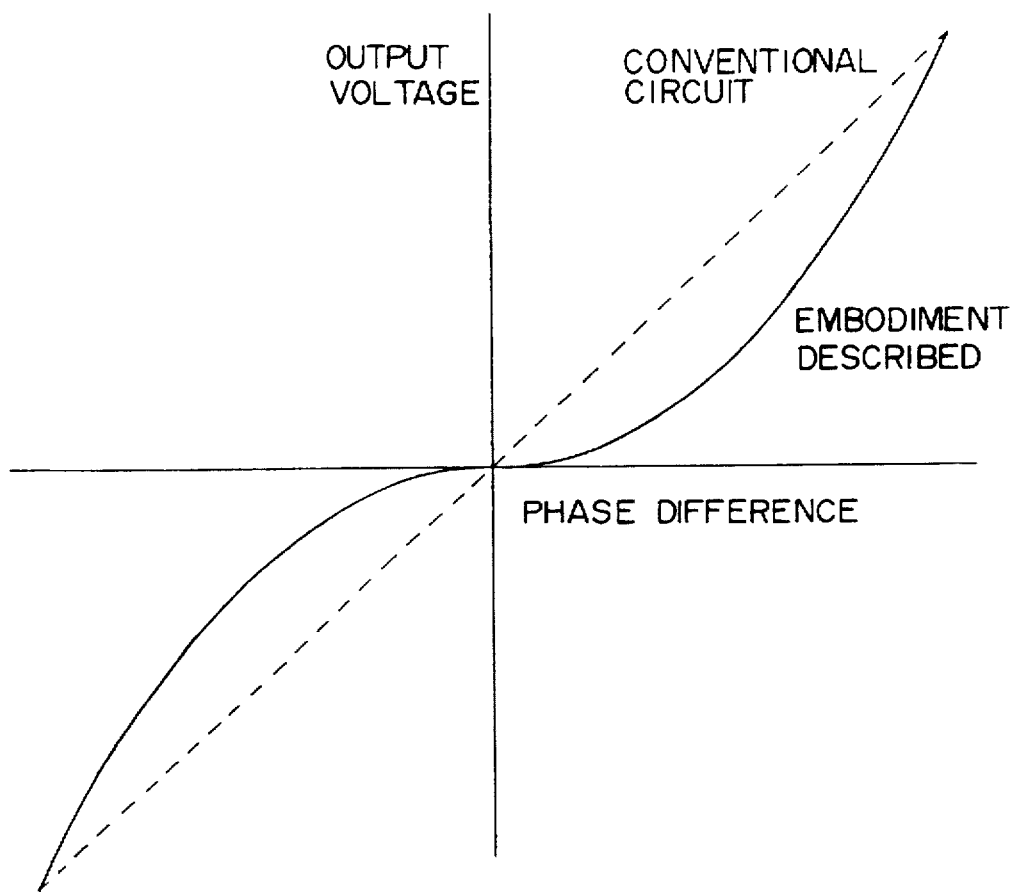
FIG. 3 is a graph showing a relationship between a phase difference and a voltage for driving a loop filter in the present invention and in the prior art.

FIG. 3 shows a relationship between the phase difference and the output voltage of the control circuit 21. The solid line represents a relationship exhibited in this embodiment, and the broken line represents a relationship exhibited in a conventional circuit shown in FIG. 1. In the conventional circuit, there is a linear relationship between the phase difference and the output voltage of the charge pump 10, whereas there is a nonlinear relationship in this embodiment. More specifically, in this embodiment, when the phase difference $\phi$ is small, a variation $dV/d\phi$ in the output voltage V of the control circuit 21 is small with respect to a variation in the phase difference. When the phase difference $\phi$ is large, $dV/d\phi$ is large.

The control circuit 21 that effects the above-described control comprises a ripple filter circuit 29, an analog switch (SW) 30, and a phase comparator 31. The ripple filter circuit 29 smoothes the phase comparison output signal of the phase comparator 20. The phase comparator 31 determines a phase difference between the reference signal fr and the compared signal fv, and outputs a control signal that corresponds to the phase difference as a switch signal, to the analog switch 30. The analog switch 30 functions as a charge pump and outputs an output signal of the ripple filter circuit 29 to the loop filter 22 when the switch signal is ON. As the phase difference becomes large, a period of time during which the switch signal is ON is increased. Therefore, the output signal of the control circuit 21 has a voltage in proportion to the phase difference determined by the phase comparator 20 and has a pulse width in proportion to the phase difference determined by the phase comparator 31. Accordingly, the phase comparison sensitivity of the phase synchronous circuit shown in FIG. 2 is in proportion to the phase difference, and the output voltage is in proportion to the square of the phase difference determined by the phase comparator 31. The loop filter 22 smoothes the output signal of the control circuit 21, and outputs the control signal to control the VCO 24. The VCO 24 produces an oscillated signal having a frequency that corresponds to this control voltage.

Figure 4:
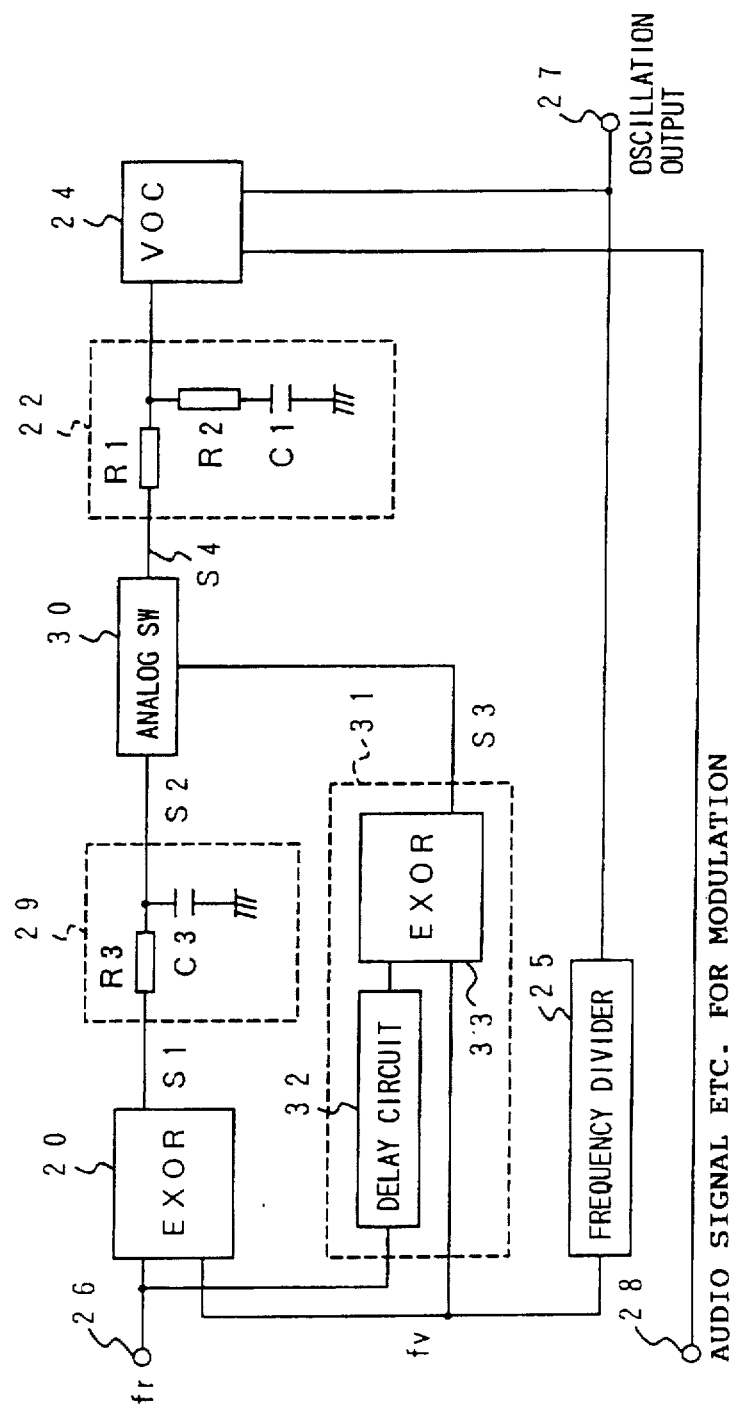
FIG. 4 is a block diagram showing details of parts of the construction shown in FIG. 2.

FIG. 4 is a block diagram showing the details of parts of the construction shown in FIG. 2. The phase comparator 20 is constituted of an exclusive OR (EXOR) circuit. The ripple filter circuit 29 of the control circuit 21 is constituted of a resistor R3 and a capacitor C3. The phase comparison circuit 31 is constituted of a delay circuit 32 and an exclusive OR (EXOR) circuit 33. The delay circuit 32 delays the reference signal fr by a predetermined time so as to adjust the timing at which the reference signal fr is compared with the compared signal fv. Specifically, the reference signal fr is delayed by 90°. As a result, when there is a phase difference of 90° between the reference signal fr and the compared signal fv, the pulse width of the output signal of the exclusive OR circuit 33 is zero. The switch signal output by the exclusive OR circuit 33 is output to the analog switch 30. The loop filter 22 has the same construction as the loop filter 12 shown in FIG. 1.

FIGS. 5A and 5B are timing charts showing an operation of the phase synchronous circuit shown in FIG. 4. FIG. 5A shows an operation for a case where there is a small phase difference between the reference signal fr and the compared signal fv, and FIG. 5B shows an operation for a case where there is a large phase difference. When the reference signal fr and the compared signal fv are as shown in FIG. 5A, the output signal S1 of the phase comparator 20 as shown in FIG. 5A results. FIG. 5A also shows a signal S2 obtained by smoothing S1 by the ripple filter circuit 29. While the output signal S1 is at a high level, charges are built up in the capacitor C3 of the ripple filter circuit 29 so that the amplitude (voltage value) of the output signal S2 increases. While the output signal S1 is at a low level, charges built up in the capacitor C3 are dissipated so that the amplitude of the output voltage S2 decreases.

The delay circuit 32 delays the reference signal fr by 90° and outputs the signal indicated by the broken line in FIG. 5A. The phase comparator 33 compares the phase of the delayed reference signal fr and the phase of the compared signal fv so as to output a pulse signal S3 that corresponds to the phase difference, as shown in FIG. 5A. The pulse signal S3 is fed to the analog switch 30 as a switch signal, and the analog switch 30 outputs a control signal S4 as shown in FIG. 5A to the loop filter 22.

FIG. 5B shows a case where there is a larger phase difference between the reference signal fr and the compares signal fv than the phase difference of FIG. 5A. Referring to FIG. 5B, the amplitude of the signal S2 obtained by the ripple filter circuit 29 is larger than the corresponding amplitude in FIG. 5A, and the pulse width (ON duration) of the switch signal S3 is also greater than the corresponding pulse width in FIG. 5A. In this way, the output signal of the control circuit 21, that is, the output signal of the analog switch 30 has a voltage in proportion to the phase difference determined by the phase comparator 20 and a pulse width in proportion to the phase difference determined by the phase comparator 31.

As shown in FIGS. 5A and 5B, the output signal S4 of the analog switch 30 that functions as a charge pump is a portion of the signal that has passed through the ripple filter circuit 29. Therefore, unlike the conventional output signal of the charge pump, the output signal S4 does not vary between the extremes, that is, between the power supply voltage and the ground voltage. Therefore, the low pass filter that is necessary in the conventional art may be omitted.

Figure 6:
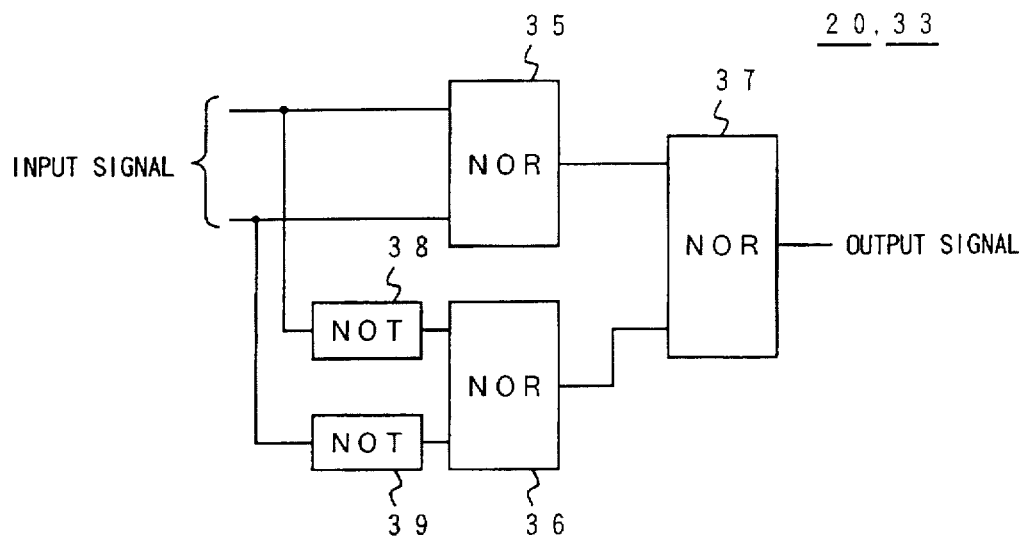
FIG. 6 is a block diagram showing an example of the construction of an exclusive OR circuit shown in FIG. 4.

FIG. 6 is a block diagram showing an example of the construction of the exclusive OR circuits 20 or 33 shown in FIG. 4. As shown in FIG. 6, the exclusive OR circuit comprises three NOR circuits 35, 36 and 37, and two NOT circuits 38 and 39.

Figure 7:
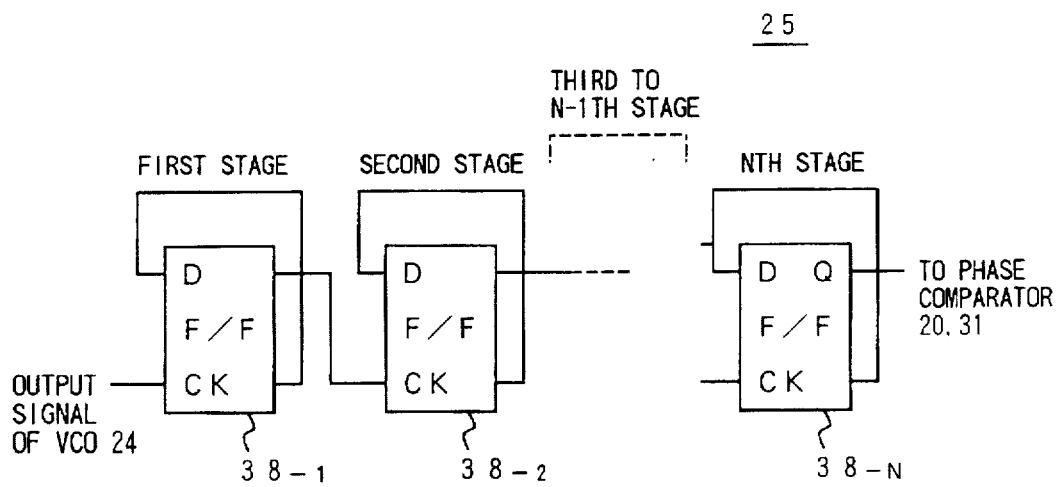
FIG. 7 is a block diagram showing an example of the construction of a frequency divider shown in FIG. 4.

FIG. 7 is a block diagram showing an example of the construction of the frequency divider 25 shown in FIG. 4. As shown in FIG. 7, the frequency divider 25 is constructed of a total of N D flip-flops 38-1, 38-2, . . . , 38-N in cascade connection. The oscillated output signal of the VCO 24 is fed to a clock input terminal CK of the first flip-flop 38-1, and the frequency-divided signal is output from a data output terminal Q of the Nth flip-flop 38-N.

Figure 8:
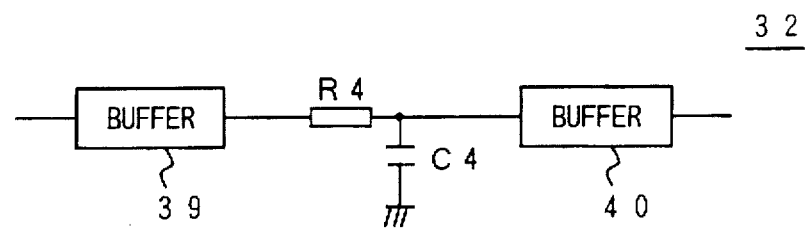
FIG. 8 is a block diagram showing an example of the construction of a delay circuit shown in FIG. 4.

FIG. 8 is a block diagram showing an example of the construction of the delay circuit 32 shown in FIG. 4. The delay circuit 32 shown in FIG. 8 comprises buffers 39 and 40, and a filter having a resistor R4 and a capacitor C4. The reference signal fr charges the capacitor C4 via the buffer 39 so that a delayed signal is output via the buffer 40. The delay time depends on the time constant of the filter.

Figure 9:
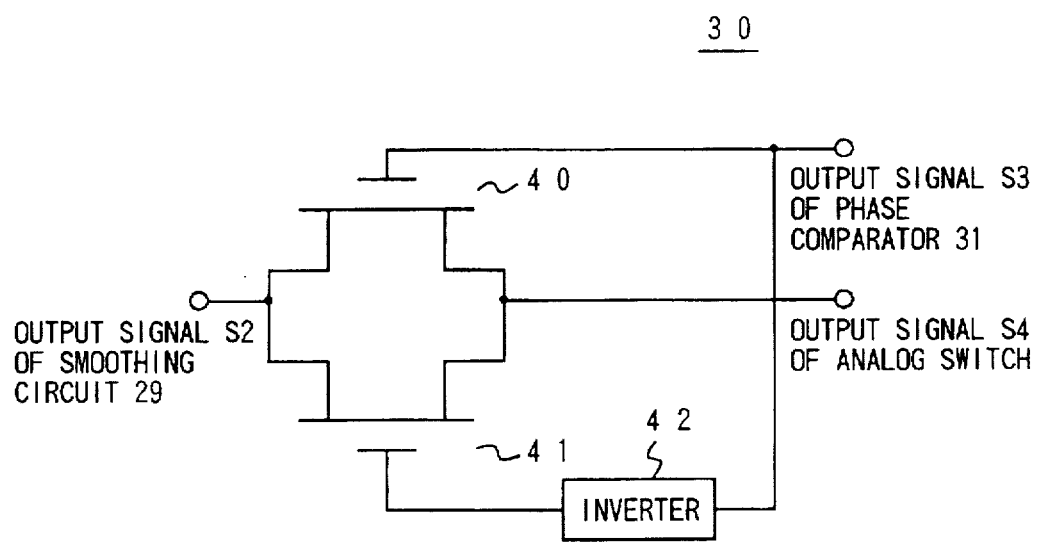
FIG. 9 is a block diagram showing an example of the construction of an analog switch shown in FIG. 4.

FIG. 9 is a block diagram showing an example of the construction of the analog switch 30 shown in FIG. 4. The analog switch 30 has two MOS transistors 40 and 41 having different polarities, and an inverter 42. The drains (sources) of the transistors 40 and 41 are fed the output signal S2 of the ripple filter circuit 29. The sources (drains) of the transistors 40 and 41 output the output signal S4. The output signal S3 of the phase comparator 31 is fed to the gate of the transistor 40, and a signal obtained by inverting the output signal S3 by the inverter 42 is fed to the gate of the transistor 41. When the output signal S3 is at a high level, the transistors 40 and 41 are turned ON, and when the output signal S3 is at a low level, the transistors 40 and 41 are turned OFF.

FIG. 10 is a circuit diagram showing an example of the construction of the VCO 24 (see U.S. Pat. No. 5,047,733). The VCO 24 comprises a bipolar transistor T1, a varactor diode VC1, resistors R11, R12 and R13, inductors L1 and L2, capacitors C11, C12, C13, C14 and C15, and an adder circuit 43. The adder circuit 43 adds the output signal of the loop filter 22 to the modulating signal. Predetermined voltages Vcc and Vee are provided as power supply voltages as shown in FIG. 10. The oscillated output signal of the VCO 24 is fed to an output terminal 27 via a capacitor C16.

Figure 11:
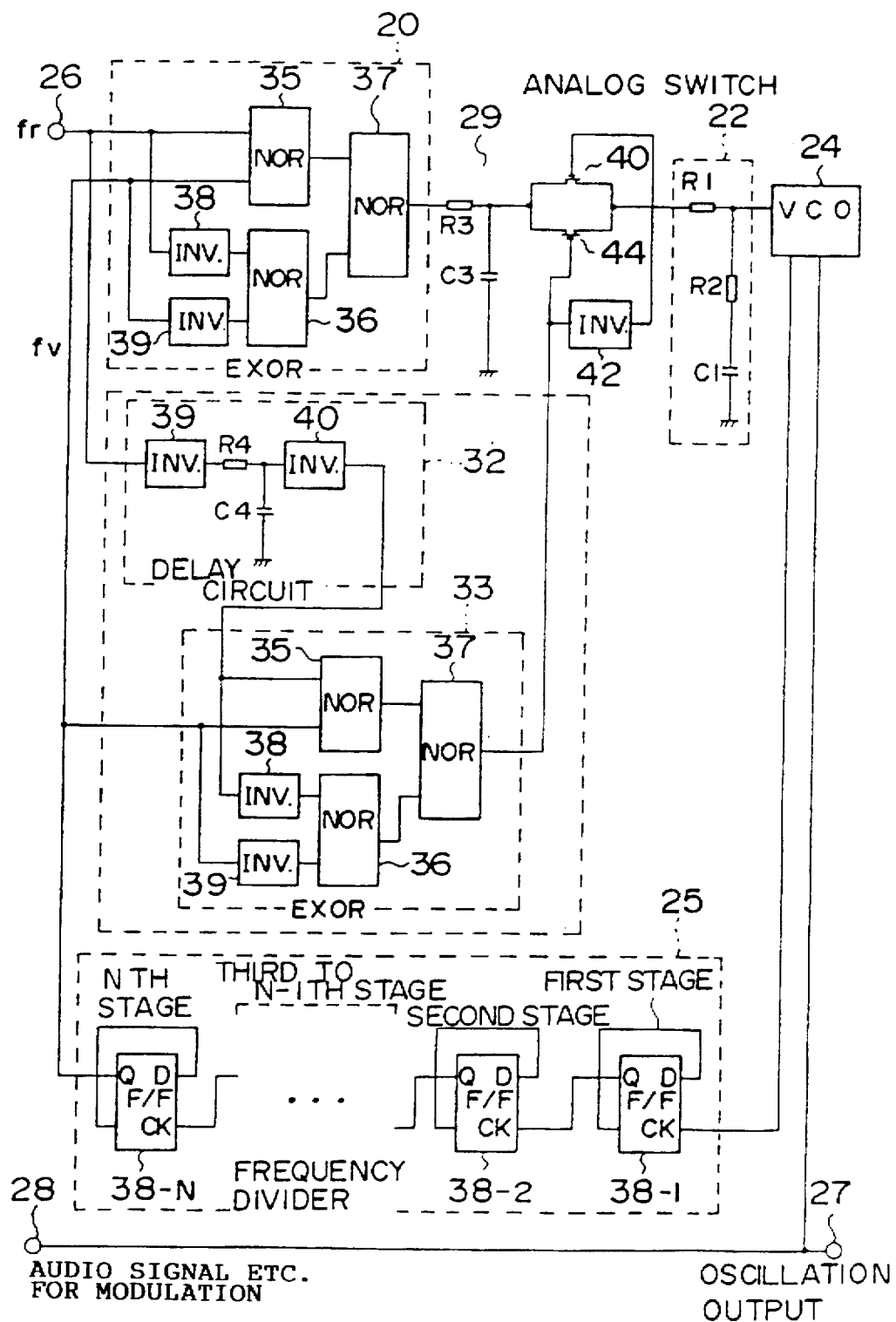
FIG. 11 is a block diagram showing details of an overall construction shown in FIG. 4.

FIG. 11 is a block diagram showing the overall construction of the phase synchronous circuit obtained by combining the constructions shown in FIG. 4 and FIGS. 6 through 9. In FIG. 11, those components that are the same as the components shown in the earlier drawings are designated by the same reference numerals.

The constructions of the parts shown in FIG. 2 are not limited to those hitherto described. Any other construction may be employed as long as the function required of each of the parts is realized.

Figure 12:
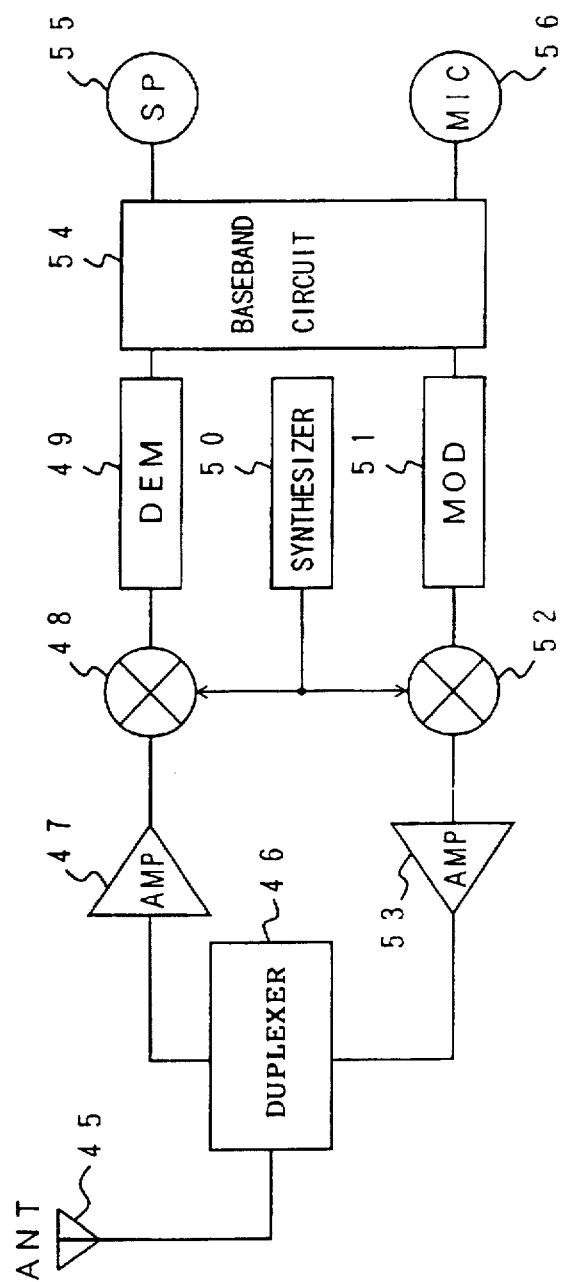
FIG. 12 is a block diagram showing an example of the construction of a portable telephone set equipped with a modulating circuit in which the phase synchronous circuit of the present invention is used.

FIG. 12 is a block diagram showing an example of the construction of a portable telephone set equipped with a modulating circuit in which the phase synchronous circuit described above is used. The portable telephone set shown in FIG. 12 comprises an antenna (ANT) 45, an antenna duplexer 46, an amplifier (AMP) 47, a mixer 48, a demodulator (DEMO) 49, a synthesizer 50, a modulator (MOD) 51, a mixer 52, an amplifier (AMP) 53, a baseband circuit 54, a speaker (SP) 55 and a microphone (MIC) 56.

The radio wave received via the antenna is fed to the mixer 48 via the duplexer 46 and the amplifier 47. A frequency difference between the received signal and an output signal of the synthesizer 50 is fed to the demodulator 49. A demodulated signal obtained by the demodulator 49 is subjected to a baseband signal process by the baseband circuit 54. The resultant baseband signal is output to the speaker 55. An audio signal from the microphone 56 is subjected to a baseband process by the baseband circuit 54. The resultant modulated signal is fed to the modulator 51. The modulator 51 has a modulating circuit in which the phase synchronous circuit described above is used. An output signal of the modulator 51 is added to an oscillated signal from the synthesizer 50 so that the resultant signal is output to the antenna 45 via the amplifier 53 and the duplexer 46.

The reference signal fr of the modulating circuit shown in FIG. 2 may be generated by a predetermined reference signal generator (not shown). Alternatively, a signal obtained as a result of a frequency division of the output of the synthesizer 50 may be used as the reference signal fr.

By using a modulating circuit in which the phase synchronous circuit is used in the transmitter system of the portable telephone set, it is possible to realize an improved transmitter system having a favorable characteristic. In the improved transmitter system, the phase comparison sensitivity and the response speed are high when the frequency is switched. The phase comparison sensitivity is low after the in-phase condition is established so that the oscillation frequency is enabled to vary depending on the modulating signal.

Figure 13:
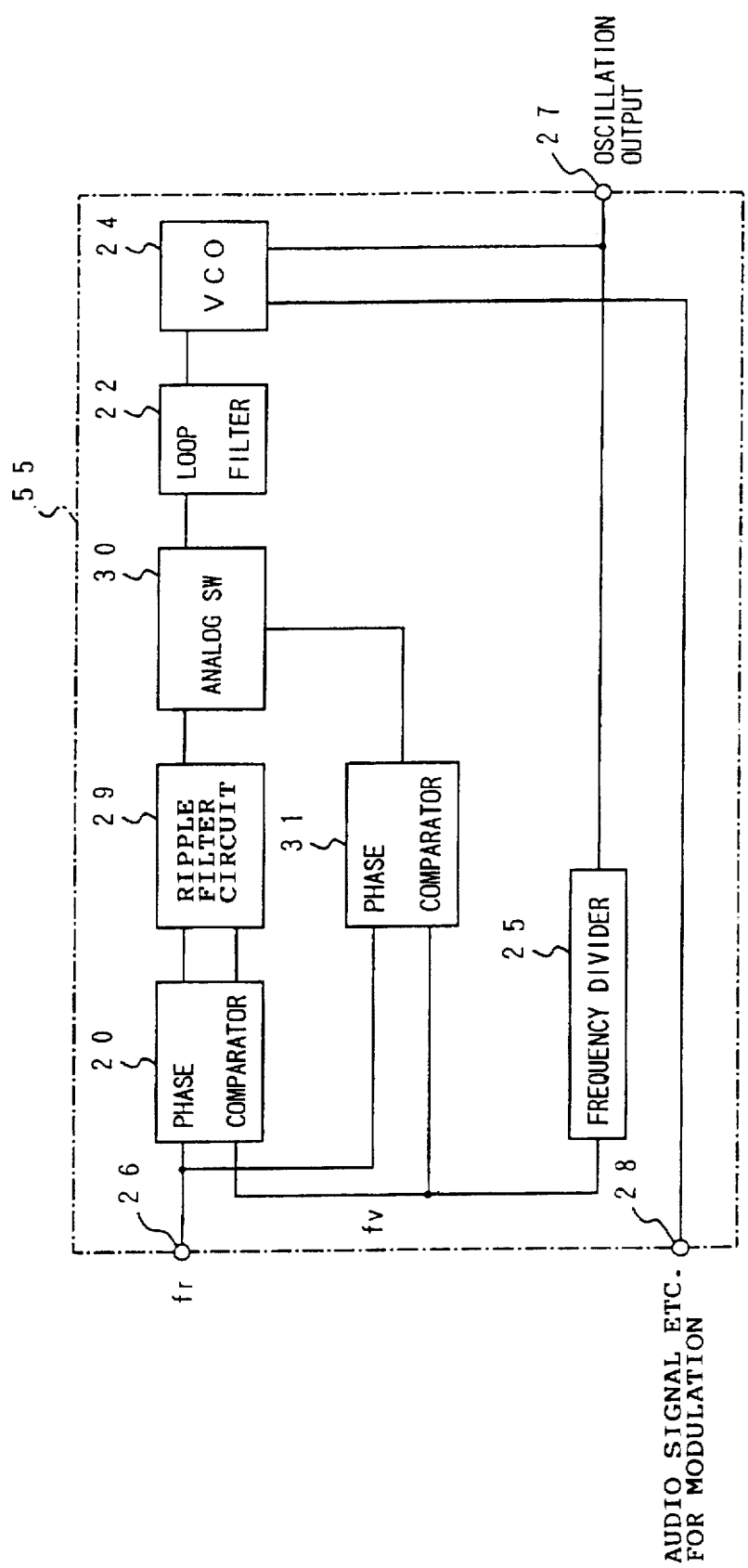
FIG. 13 is a block diagram showing a first example of the construction in which the phase synchronous circuit of the present invention is turned into a module or integrated.

The phase synchronous circuit described above may be turned into a module or an integrated circuit device provided on a chip, as indicated by a block 55 of FIG. 13. When the phase synchronous circuit is turned into a module, discrete parts and integrated circuits are mounted on a circuit board.

Figure 14:
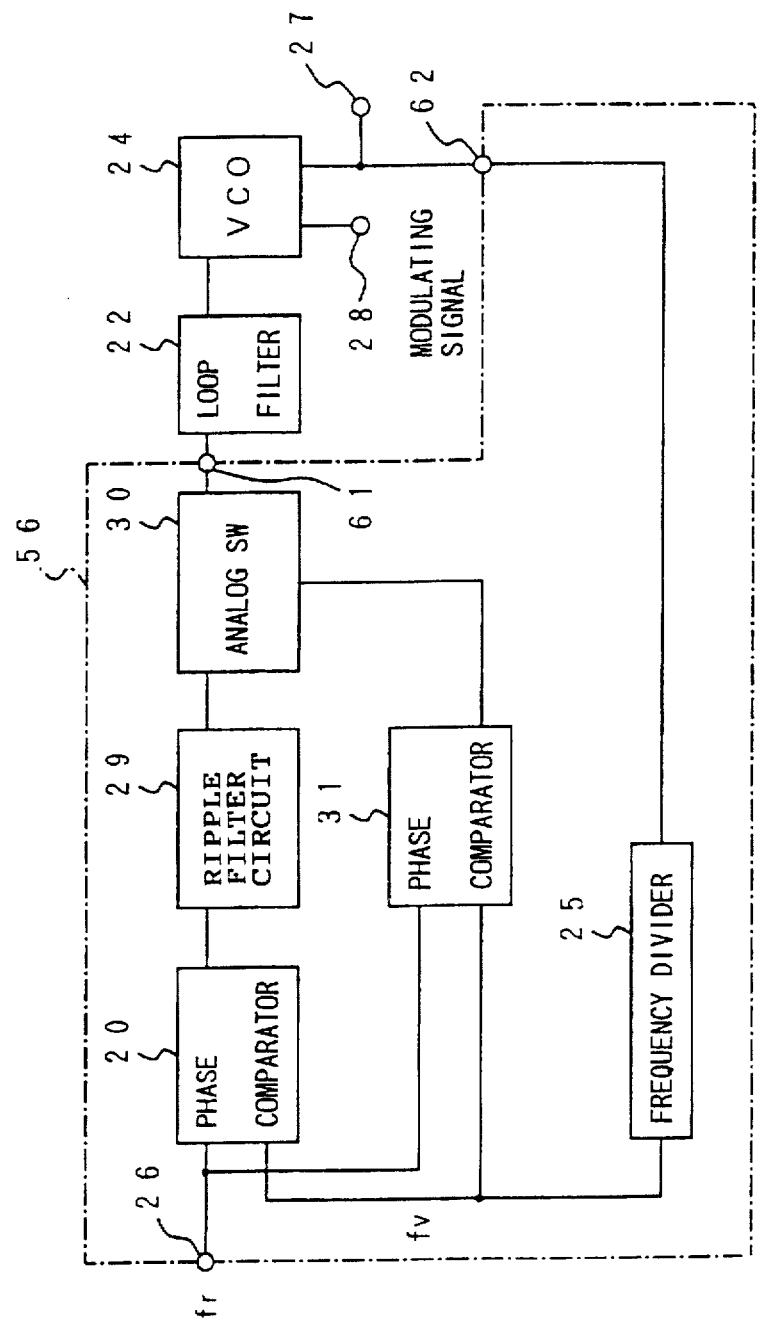
FIG. 14 is a block diagram showing a second example of the construction in which the phase synchronous circuit of the present invention is turned into a module or integrated.

Alternatively, as shown in FIG. 14, some components of the phase synchronous circuit may be turned into a module or an integrated circuit device 56, while the remaining components are provided external to the module or the circuit device. In the example of FIG. 14, the loop filter 22 and the VCO 24 are external components. Specifically, the circuit device 56 has a connection terminal 61 connectable to the output of the analog switch 30, and a connection terminal 62 which is fed the output voltage of the VCO 24 and outputs the same to the frequency divider 25.

Figure 15:
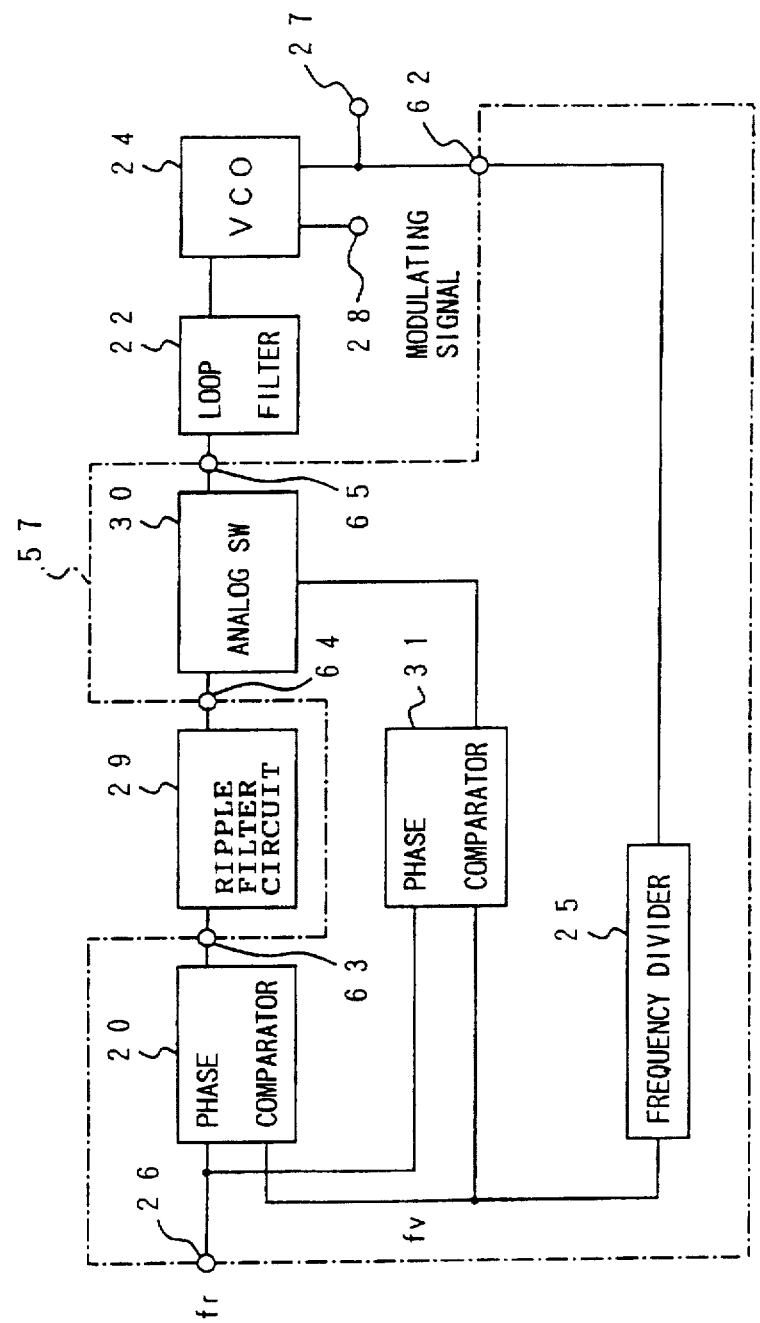
FIG. 15 is a block diagram showing a third example of the construction in which the phase synchronous circuit of the present invention is turned into a module or integrated.

FIG. 15 shows a circuit device 57 in which more components are provided as external components than the circuit device 56 of FIG. 14. The construction of FIG. 15 is especially suitable for integration and based upon a knowledge that the filters 22 and 29, and the VCO 24 are not suitable for integration unlike the other components. The construction of FIG. 15 is also designed to adapt to a variety of needs of the user. Specifically, in addition to the connection terminal 62 described above, the circuit device 57 has a connection terminal 63 connectable to the output terminal of the phase comparator 20, a connection terminal 64 connectable to an input terminal of the analog switch 30 and a connection terminal 65 connectable to an output terminal of the analog switch 30. The ripple filter circuit 29 provided external to the circuit device 57 is connected across the connection terminals 63 and 64, as shown in FIG. 15. The input terminal of the loop filter 22 is connected to the connection terminal 65 as shown in FIG. 15.

The present invention is not limited to the above described embodiments, and variations and modifications may be made without departing from the scope of the present invention.

What is claimed is:

1. A phase synchronous circuit in which a phase of a reference signal and a phase of a compared signal that corresponds to an oscillation signal output by an oscillator are compared with each other, comprising:

a phase comparator for outputting a phase comparison output signal which corresponds to a phase difference between said reference signal and said compared signal, to said oscillator via a filter; and a control circuit placed between said phase comparator and said filter which enables an output value of said phase comparison output signal to vary nonlinearly in accordance with the phase difference, wherein the output value of said phase comparison output signal does not vary when said phase difference is small.

2. The phase synchronous circuit as claimed in claim 1, wherein said control circuit controls said phase comparison output signal so that a phase comparison sensitivity that specifies the output value of said phase comparison output signal with respect to the phase difference becomes small as the phase difference becomes small.

3. The phase synchronous circuit as claimed in claim 1, wherein said control circuit controls said phase comparison output signal so that a variation in an amplitude of said phase comparison output signal becomes small as the phase difference becomes small.

4. A phase synchronous circuit in which a phase of a reference signal and a phase of a compared signal that corresponds to an oscillation signal output by an oscillator are compared with each other, comprising:

a first phase comparator for outputting a phase comparison output signal which corresponds to a phase difference between said reference signal and said compared signal, to said oscillator via a filter; and a control circuit placed between said first phase comparator and said filter which enables an output value of said phase comparison output signal to vary nonlinearly in accordance with the phase difference, wherein said control circuit comprises:

a ripple filter circuit smoothing said phase comparison output signal;

a switch circuit selectively outputting an output signal of said ripple filter circuit using a switch signal; and a second phase comparator outputting said switch signal in accordance with a phase difference between a signal obtained by delaying said reference signal and said compared signal.

5. The phase synchronous circuit as claimed in claim 1, wherein said oscillation signal includes a modulating signal.

6. A circuit device comprising:

a phase comparator comparing a phase of a reference signal with a phase of a compared signal that corresponds to an oscillation signal output by an oscillator, and outputting a phase comparison output signal that corresponds to a phase difference between said reference signal and said compared signal;

a control circuit causing an output value of said phase comparison output signal to vary nonlinearly in accordance with the phase difference;

wherein the output value of said phase comparison output signal does not vary when said phase difference is small; and a terminal connectable to an external filter which is connectable between an output of said control circuit and an input of said oscillator.

7. A circuit device comprising:

a first phase comparator comparing a phase of a reference signal with a phase of a compared signal that corresponds to an oscillation signal output by an oscillator, and outputting a phase comparison output signal that corresponds to a phase difference between said reference signal and said compared signal;

a control circuit causing an output value of said phase comparison output signal to vary nonlinearly in accordance with the phase difference; and a terminal connectable to an external filter which is connectable between an output of said control circuit and an input of said oscillator, wherein said control circuit comprises:

a ripple filter circuit smoothing said phase comparison output signal;

a switch circuit selectively outputting an output signal of said ripple filter circuit using a switch signal; and a second phase comparator outputting said switch signal in accordance with a phase difference between a signal obtained by delaying said reference signal and said compared signal.

8. A circuit device comprising:

a first phase comparator comparing a phase of a reference signal with a phase of a compared signal that corresponds to an oscillation signal output by an oscillator, and outputting a phase comparison output signal that corresponds to a phase difference between said reference signal and said compared signal;

a control circuit causing an output value of said phase comparison output signal to vary nonlinearly in accordance with the phase difference; and a terminal connectable to an external filter which is connectable between an output of said control circuit and an input of said oscillator, wherein said control circuit comprises:

a terminal connectable to a ripple filter circuit smoothing said phase comparison output signal;

a switch circuit selectively outputting an output signal of said ripple filter circuit using a switch signal; and a second phase comparator outputting said switch signal in accordance with a phase difference between a signal obtained by delaying said reference signal and said compared signal.

9. The circuit device as claimed in claim 6, wherein said control circuit controls said phase comparison output signal so that a phase comparison sensitivity which specifies the output value of said phase comparison output signal with respect to the phase difference becomes small as the phase difference becomes small.

10. The circuit device as claimed in claim 6, wherein said control circuit controls said phase comparison output signal so that a variation in an amplitude of said phase comparison output signal becomes small as the phase difference becomes small.

11. The circuit device as claimed in claim 6, wherein said oscillation signal includes a modulating signal.

12. An electronic apparatus comprising:

a modulating circuit whose output signal has a frequency that varies in accordance with a modulating signal;

a mixer circuit converting said output signal from said modulating circuit to have a transmit signal frequency;

an amplifier amplifying an output signal of said mixer circuit; and an antenna transmitting an output signal of said amplifier, wherein said modulating circuit includes a phase synchronous circuit, wherein a phase of a reference signal and a phase of a compared signal which corresponds to an output signal of said modulating circuit output via an oscillator are compared with each other by a phase comparator, and said oscillator is controlled by feeding a phase comparison output signal that corresponds to a phase difference between said reference signal and said compared signal to said oscillator via a filter; and wherein said phase synchronous circuit comprises a control circuit placed between said phase comparator and said filter which functions to cause an output value of said phase comparison output signal to vary nonlinearly in accordance with the phase difference, wherein the output value of said phase comparison output signal does not vary when said phase difference is small.

13. The electronic apparatus as claimed in claim 12, wherein said control circuit controls said phase comparison output signal so that a phase comparison sensitivity which specifies the output value of said phase comparison output signal with respect to the phase difference becomes small as the phase difference becomes small.

14. The electronic apparatus as claimed in claim 12, wherein said control circuit controls said phase comparison output signal so that a variation in an amplitude of said phase comparison output signal becomes small as the phase difference becomes small.

15. The electronic apparatus as claimed in claim 12, wherein said modulating signal is an audio signal.

* * * * *